United States Patent
Kamgaing

(10) Patent No.: US 7,262,674 B2
(45) Date of Patent: Aug. 28, 2007

(54) BANDPASS FILTER HAVING FIRST AND SECOND SERIALLY COUPLED COLLECTION OF FILTER COMPONENTS FOR PROVIDING UPPER AND LOWER REJECTION NOTCHES

(75) Inventor: Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 160 days.

(21) Appl. No.: 11/154,078

(22) Filed: Jun. 15, 2005

(65) Prior Publication Data

US 2006/0284705 A1    Dec. 21, 2006

(51) Int. Cl.
*H03H 7/075*    (2006.01)
(52) U.S. Cl. ...................... 333/168; 333/175

(58) Field of Classification Search ............... 333/175, 333/176, 168, 185, 17.1
See application file for complete search history.

(56) References Cited

U.S. PATENT DOCUMENTS

| 5,955,931 A * | 9/1999 | Kaneko et al. ............. 333/175 |
| 6,778,023 B2 * | 8/2004 | Christensen ................. 331/16 |
| 6,831,530 B2 * | 12/2004 | Ichikawa et al. ........... 333/184 |

OTHER PUBLICATIONS

Sutono, Albert, et al., "Design of Miniature Multilayer On-Package Integrated Image-Reject Filters," IEEE Transactions on Microwave Theory and Techniques, vol. 51, No. 1, Jan. 2003, pp. 156-162.
Yeung, Lap Kun, et al., "A compact Second-Order LTCC Bandpass Filter With Two Finite Transmission Zeros," Ieee Transactions on Microwave Theory and Techniques, vol. 51, No. 2, Feb. 2003, pp. 337-341.

* cited by examiner

*Primary Examiner*—Benny Lee
(74) *Attorney, Agent, or Firm*—Schwabe, Williamson & Wyatt, P.C.

(57) ABSTRACT

A bandpass filter having a transmission coefficient—frequency spectrum characteristic curve with a notch on each side of the passband is disclosed.

20 Claims, 6 Drawing Sheets

BANDPASS FILTER HAVING FIRST AND SECOND SERIALLY COUPLED COLLECTION OF FILTER COMPONENTS FOR PROVIDING UPPER AND LOWER REJECTION NOTCHES

TECHNICAL FIELD

Embodiments of the invention relate generally to the field of signal processing, and more particularly to filtering of signals.

BACKGROUND

In the current state of electronic technology, certain devices such as wireless communication devices may require the use of bandpass filters with relatively high out-of-band rejection capability in order to operate effectively. Currently available bandpass filters include, for example, Surface Acoustic Wave (SAW), Bulk Acoustic Wave (BAW) and ceramic filters that are available as discrete components. Alternative approaches have also been proposed and consist of integrating the bandpass filters directly on or into the silicon backend or package substrate. One such solution is the use of embedded circuitry containing a combination of capacitors and inductors to form a bandpass filter as depicted in FIG. 1. In this particular bandpass filter 10, there are five capacitors (C1, C2, C3, C4, and C5) and two coupled inductors (L1 and L2). This arrangement of L1 and L2 is also known as a transformer having a magnetic coupling M1-2 therebetween. The capacitor/inductor combinations, L1C4 and L2C5, form two resonators (i.e, RESONATOR 1, RESONATOR 2) that are each couple to a circuit reference line.

Referring to FIG. 2, which depicts the transmission coefficient—frequency spectrum characteristic curve of the bandpass filter 10 of FIG. 1. The two resonators set the center frequency 22 of the pass frequency band ("passband") 24 while the combination of capacitor C2 and the mutual inductance between the two inductors L1 and L2 is responsible for the strong rejection of signals at a particular frequency point, which results in the formation of a notch 26 on one side of the passband 24 of the transmission coefficient—frequency spectrum characteristic curve 20. However, such a bandpass filter design produces less than ideal results particularly for applications where strong signal rejection is required on both sides of the passband.

In FIG. 2, the y-axis represents the transmission coefficient in–dB while the x-axis represents the frequency spectrum in GHz. In this illustration, the bandpass filter 10 has a center frequency 22 of the passband 24 around 2.4 GHz. Note that on the left side of the passband 24, the transmission coefficient—frequency spectrum characteristic curve 20 includes a point of strong signal rejection or notch 26 where at the bottom of the notch 26, the transmission coefficient is near –70 dB. Note, however, that there are no notches on the right side of the passband 24. Further, the transmission coefficient above or on the high side of the passband 24 is at most about –16 dB. As a result, the bandpass filter 10 acts somewhat similar to a high pass filter rather than an effective bandpass filter that has high out-of-band rejection on both sides of the passband 24.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION OF ILLUSTRATIVE EMBODIMENTS OF THE INVENTION

Illustrative embodiments of the present invention include a bandpass filter having a transmission coefficient—frequency spectrum characteristic curve with frequency points of strong signal rejection seen as notches on opposite sides of a passband. As a result, a sharp roll-off of the filter response over frequency may be achieved, leading to relatively high signal rejection on both sides of the passband.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific materials and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

Figure 1:
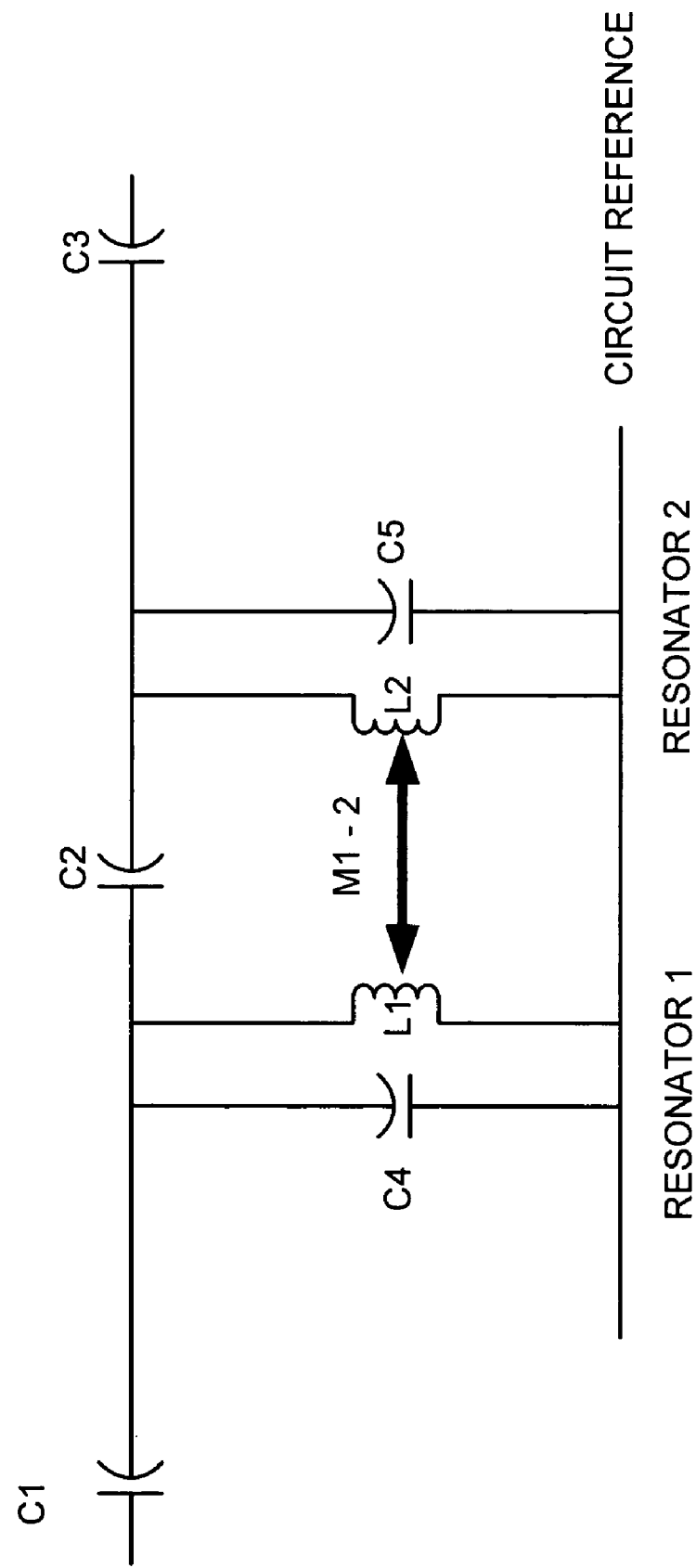
FIG. 1 illustrates a prior art bandpass filter.
Figure 2:
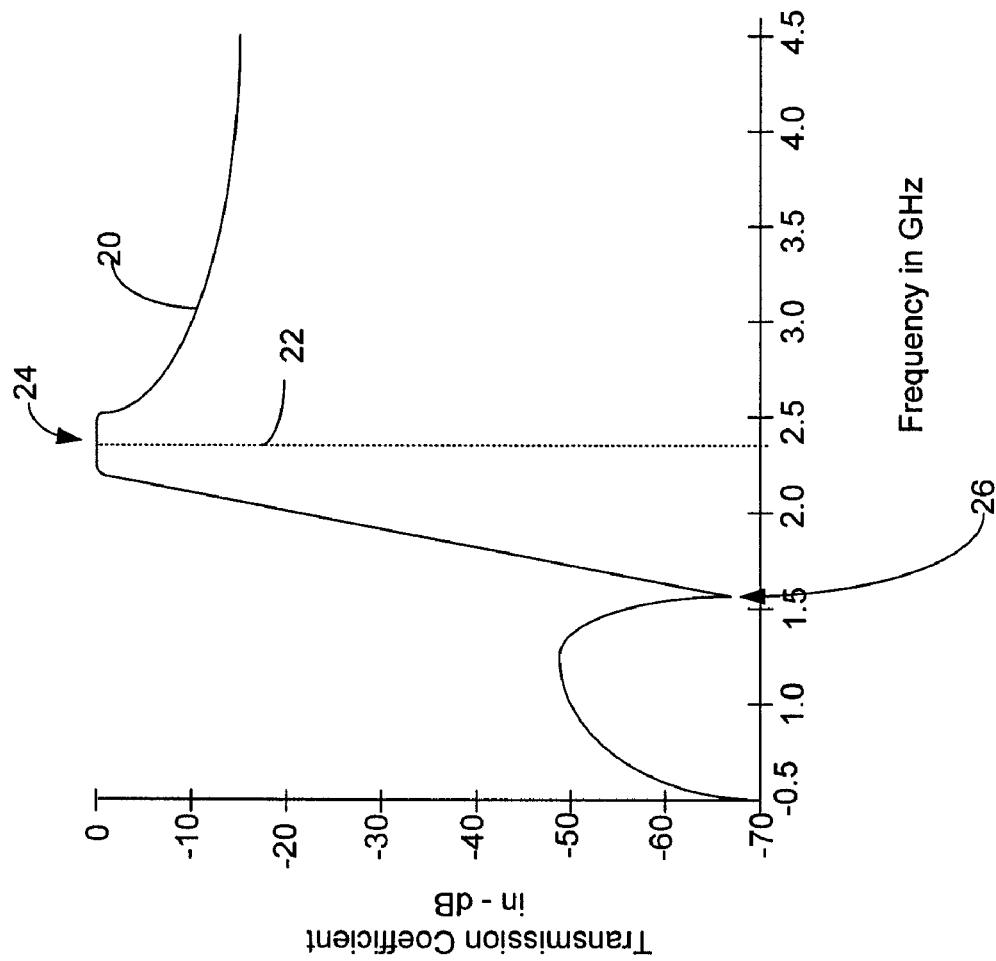
FIG. 2 illustrates a graphical representation of the transmission coefficient—frequency spectrum characteristic curve of the bandpass filter of FIG. 1.
Figure 3:
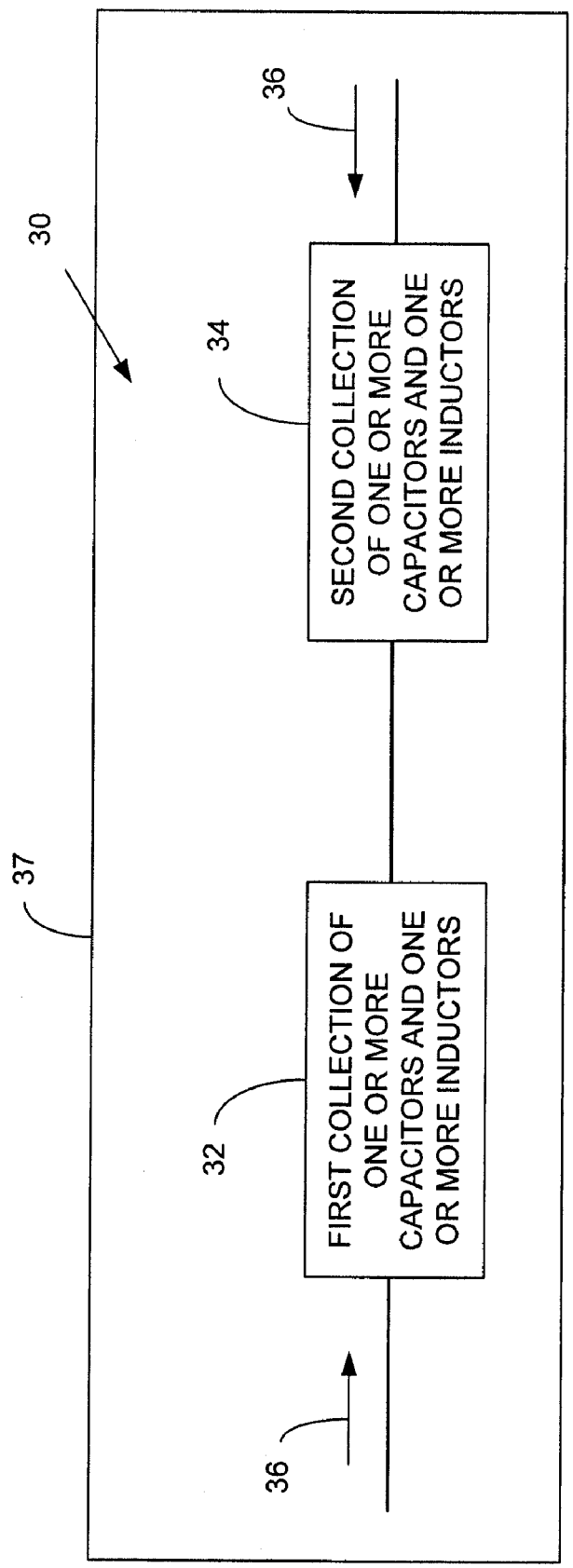
FIG. 3 is a block diagram of a bandpass filter in accordance with some embodiments.

FIG. 3 is a block diagram of a bandpass filter having a transmission coefficient—frequency spectrum characteristic curve with frequency points of strong signal rejection seen as notches on opposite sides of a passband, in accordance with some embodiments. For the embodiments, the bandpass filter 30 may include a first collection of one or more capacitors and one or more inductors ("first collection") 32 and a second collection of one or more capacitors and one or more inductors ("second collection") 34. The first and second collections 32 and 34 may be serially coupled to filter a signal. Note that the term "signal" as used in this description, for ease of understanding, may refer to a signal that is actually made up of multiple signals having different frequencies. The bandpass filter 30 may be integrated directly into, for example, a substrate 37. The substrate 37 may be a semiconductor substrate such as silicon, gallium arsenide, or non-conductive package substrate such as laminate, low-temperature co-fired ceramic used in electronic packaging. Alternatively, the filter may be formed using stand-alone discrete passive components.

The signal to be filtered may be received from either the right or left side of the bandpass filter 30 as indicated by ref. 36 (e.g., the signal being filtered may be initially received through the first collection 32 or initially received through the second collection 34). The first and second collections 32 and 34 may jointly form a bandpass filter having transmission coefficient—frequency spectrum characteristic curve with two notches, one notch on each side of the passband (see FIG. 5).

As briefly described above, the bandpass filter 30 may be integrated or embedded into a substrate such as a package or carrier substrate. The substrate, in some embodiments, may be part of a communication device such as those that are employed in wireless fidelity (WiFi), WiMax, ultra wide band (UWB), or cellular band environments. For these embodiments, the substrate may include other circuitry and may process signals that operate at WiFi or WiMax frequency bands, e.g. 2.4 and 5.0 GHz.

Figure 4:
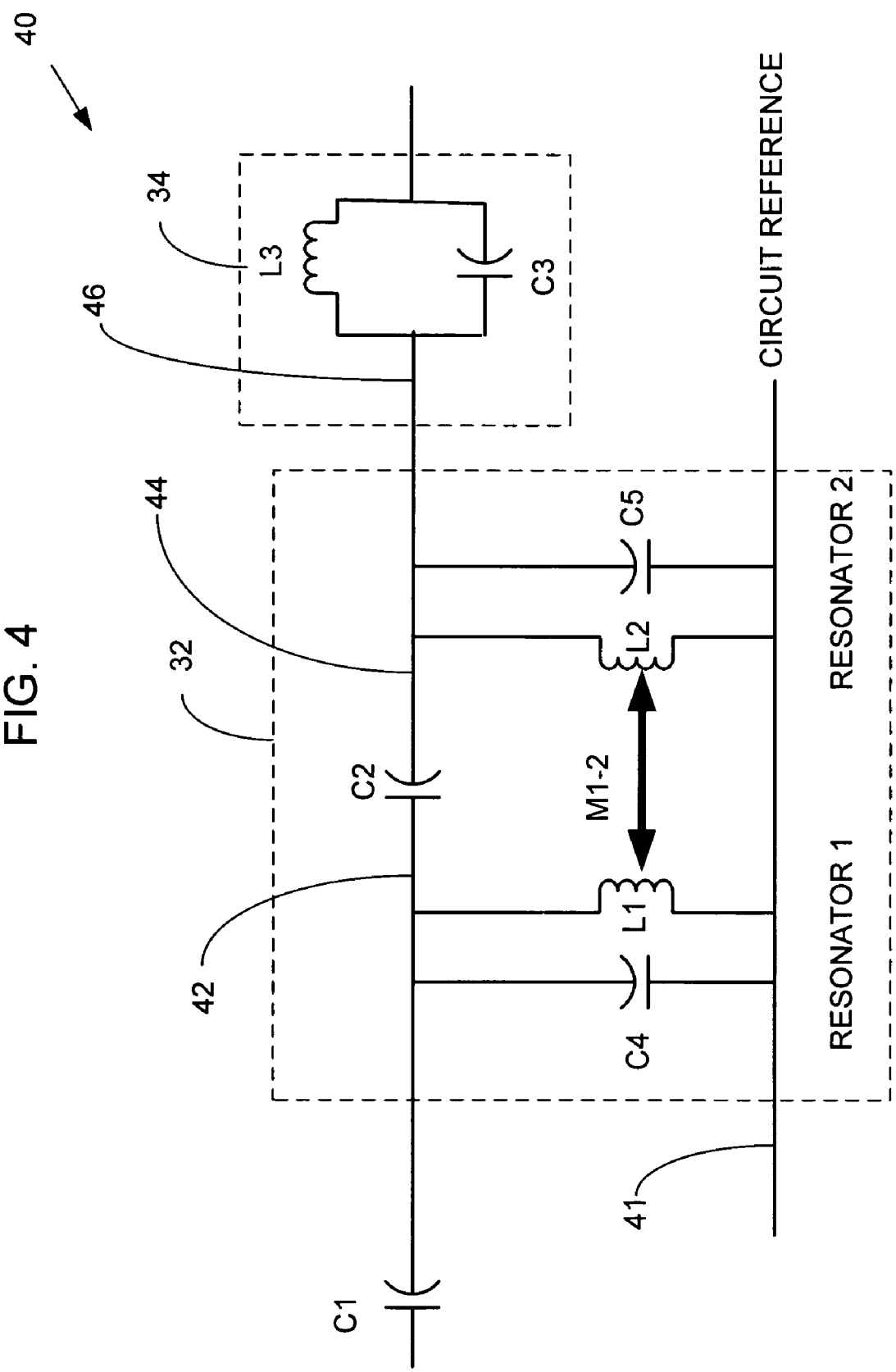
FIG. 4 illustrates a variant of the bandpass filter of FIG. 3 in further detail in accordance with some embodiments.

FIG. 4 generally depicts a variant of the bandpass filter 30 of FIG. 3 in further detail in accordance with some embodiments. For the embodiments, the bandpass filter 40 has an additional capacitor C1 that is serially coupled to the first collection 32. Note that capacitor C1 may be a matching capacitor and may be omitted depending on the rejection requirements at very low frequencies. For the embodiments, the first collection 32 may include three capacitors C2, C4, and C5, and two coupled inductors L1 and L2. The first collection 32 may include two resonators. Each resonator may be formed by a combination of one capacitor and one inductor (C4L1 for resonator 1 and C5L2 for resonator 2) that are parallel to each other. Capacitor C4 and inductor L1 of resonator 1 may both be coupled to a circuit reference 41, which in some cases may be ground, on one side, and coupled to a first conductive line 42 on the other side. Similarly, for resonator 2, capacitor C5 and inductor L2 may both be coupled to the circuit reference 41, which in some cases may be the ground, on one side, and coupled to a second conductive line 44 on the other side. The first and second conductive lines 42 and 44 are coupled together via capacitor C2, which is located between the first and second resonators and linking, at least in part, the two resonators together. Note that a transformer may be formed out of the two inductors L1 and L2 that may result in a certain magnetic coupling M1-2 between the two sides. Further note that in this case, capacitor C1 is coupled to one end of the first conductive line 42 that is at the opposite end from the end of the first conductive line 42 where capacitor C2 couples with the first conductive line 42.

The bandpass filter 40 may further include a second collection 34 that includes at least one capacitor and at least one inductor. For the embodiments, the at least one capacitor C3 is in parallel with the at least one inductor L3 and may have a common lead or node 46 that may be serially coupled to the first collection 32 via, for example, the end of the second conductive line 44. The other end of the second conductive line 44 may be coupled to the capacitor C2.

Figure 5:
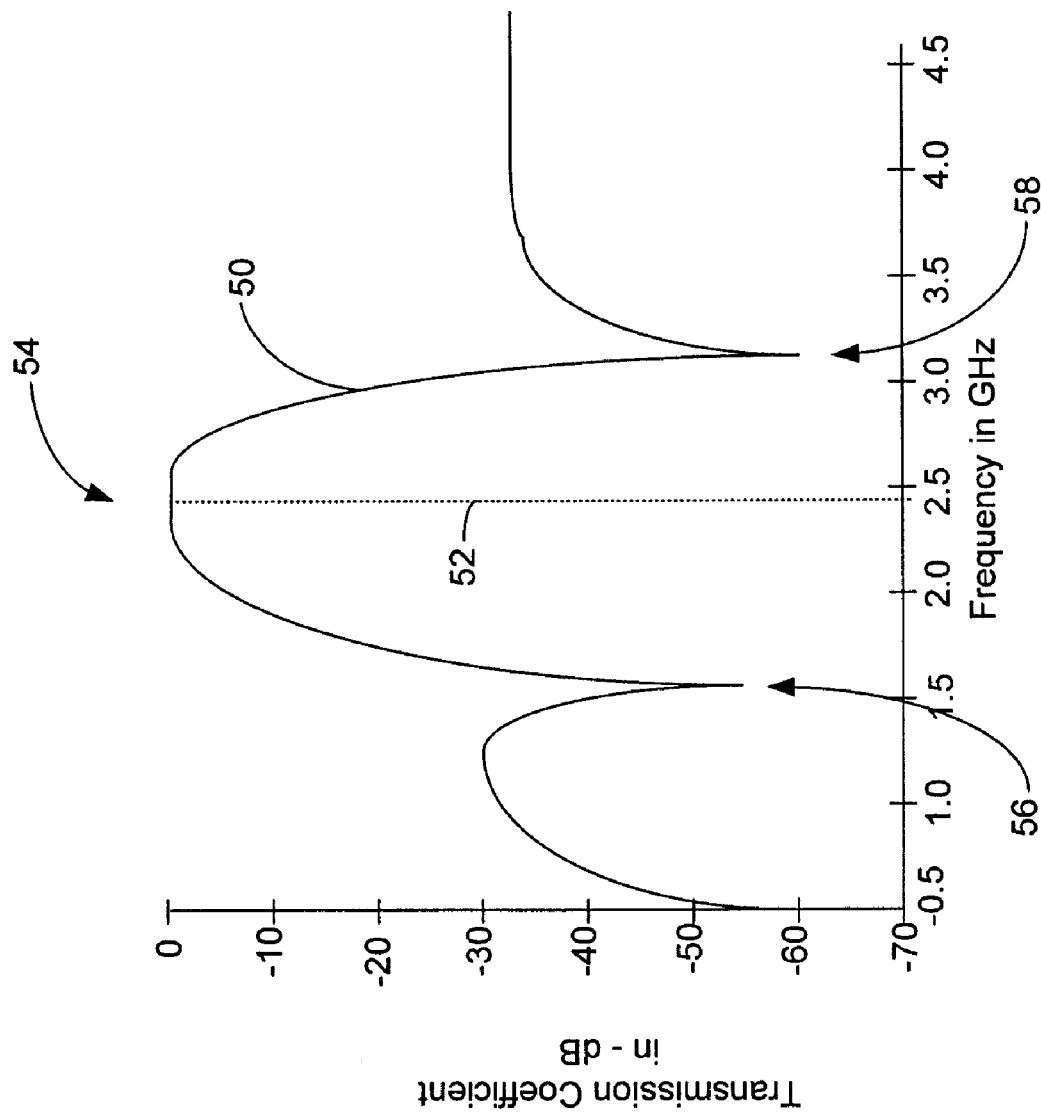
FIG. 5 illustrates a graphical representation of the transmission coefficient—frequency spectrum characteristic curve of the bandpass filter of FIG. 4 in accordance with some embodiments.

Referring now to FIG. 5, which depicts the transmission coefficient—frequency spectrum characteristic curve of the band pass filter 40 of FIG. 4. In FIG. 5, the y-axis represents the transmission coefficient in–dB while the x-axis represents the frequency spectrum in GHz. For the embodiments, the transmission coefficient—frequency spectrum characteristic curve 50 includes a pass frequency band ("passband") 54 and two notches 56 and 58, each of the notches 56 and 58 on the opposite sides of the passband 54. Note that, in this case, the signals having frequencies outside of the two notches 56 and 58 relative to the passband 54 will have transmission coefficients that are at least 20 dB less than the signals having frequencies within the passband 54 and in some cases, transmission coefficients that are at least 30 dB less than the signals having frequencies within the passband 54.

In various embodiments, the two resonators of the first collection 32 may determine the location of the center frequency 52 while capacitor C2 along with the mutual inductance between the two inductors L1 and L2 may be responsible for the formation of a first notch (56 or 58) on one side of the passband 54, while the second notch (56 or 58) may be formed by the second collection 34. The specific size, shape, and locations of the various parts (e.g., notches 56 and 58, passband 54, etc.) of the transmission coefficient—frequency spectrum characteristic curve 50 may be set by employing the appropriate bandpass filter components (e.g., capacitors and inductors) with the appropriate characteristics. For example, by selecting the appropriate types of capacitors and inductors for the bandpass filter 40, the passband (as well as the notches) may be moved to either a higher or lower location on the frequency spectrum.

A notch, which is sometimes referred to as transmission zero, may be seen as a frequency point, where the thru impedance of the transmission path is so high that only little or no signal can be transferred between the two ports of the electrical network.

Operationally, the bandpass filter 40 may be employed by initially receiving a signal to be filtered and processing the received signal through the first collection 32 and the second collection 34. The signal to be filtered may be initially received either through the first or the second collection 32 or 34 as indicated by ref. 36. Note that the reception of the signal to be filtered through capacitor C1 is not discussed here because as indicated previously, in some instances, capacitor C1 may be omitted. Regardless of which direction the signal comes from, the result is that the first and second collections 32 and 34 cooperate together to form a bandpass filter having relatively high out-of-band rejection characteristics and being able to generate a filtered signal being substantially within the passband.

Figure 6:
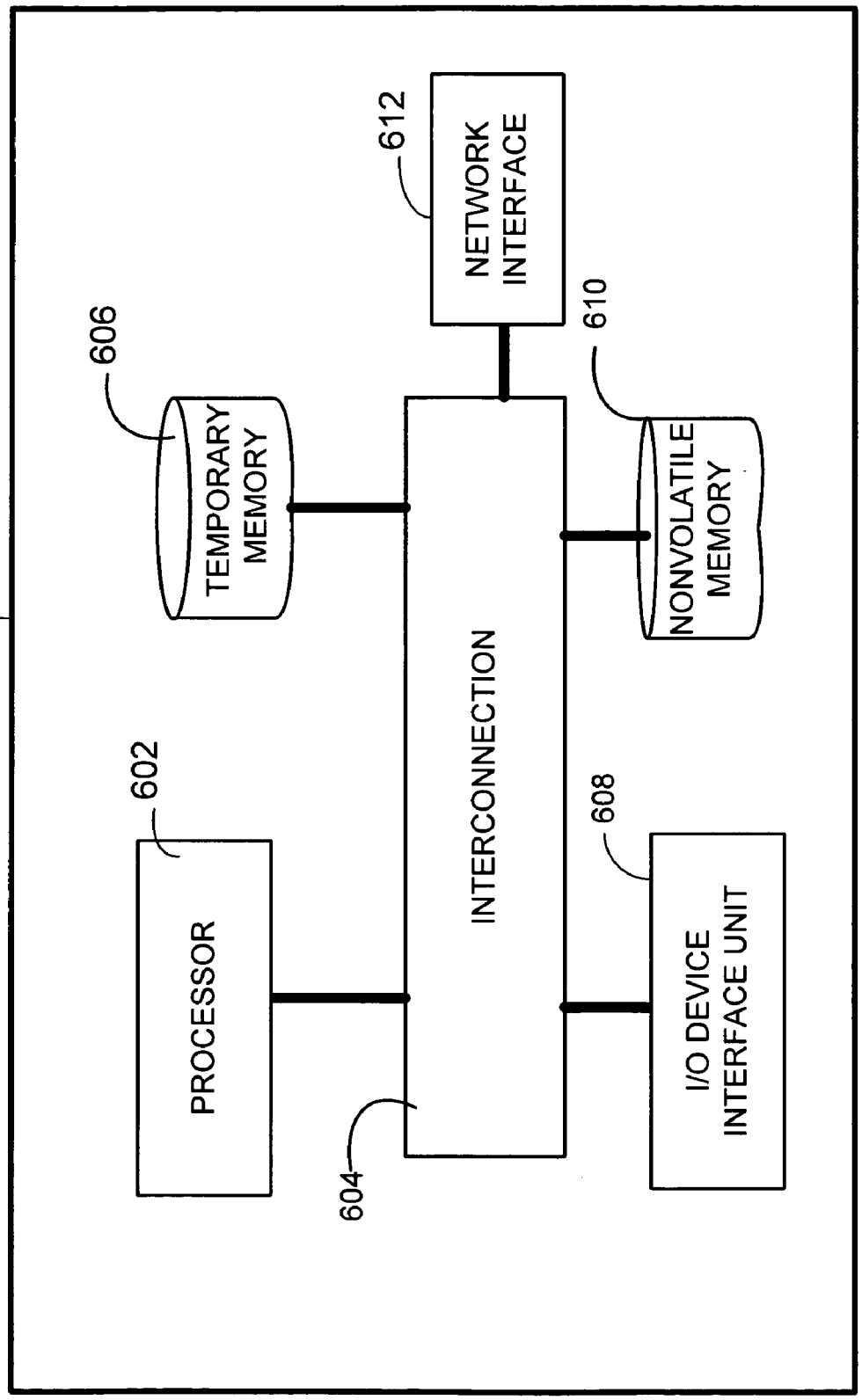
FIG. 6 is a block diagram of an example system that includes a bandpass filter of FIG. 4 with the transmission coefficient—frequency spectrum characteristic curve of FIG. 5, in accordance with some embodiments.

Referring now to FIG. 6 depicting a system 600 in accordance with some embodiments. The system 600 may include a processor 602, which in some cases may be a microprocessor, coupled to an interconnection 604, which may include one or more chips. The system 600 may further include temporary memory 606, a network interface 612, an optional nonvolatile memory 610 (such as a mass storage device), and an input/output (I/O) device interface unit 608. In some embodiments, the input/output device interface unit 608 may be adapted to interface a keyboard, a keypad, a cursor control device, and/or other devices. The system 600, in some embodiments, may be a set-top box, a wireless mobile phone, a wireless radio, a tablet computing device, a workstation, or a laptop-computing device.

The system 600, in some embodiments, may be a wireless communication device and may further include an antenna[e] such as one or more substantially omnidirectional antenna[e] that may be coupled to the network interface 612. In some embodiments, the system 600 may be an access point or a station of a wireless local area network (WLAN). One or more of the above-enumerated components, such as the processor 602, may be part of an electronic package that may include, for example, a die coupled to a package substrate. In various embodiments, one or more of the system components described above may include the novel bandpass filter described above.

Accordingly, a bandpass filter having transmission coefficient—frequency spectrum characteristic curve with two notches, one notch on each side of the passband has been described in terms of the above-illustrated embodiments. It will be appreciated by those of ordinary skill in the art that a wide variety of alternate and/or equivalent implementations calculated to achieve the same purposes may be substituted for the specific embodiments shown and described without departing from the scope of the present invention. Those of ordinary skill in the art will readily appreciate that the present invention may be implemented in a very wide variety of embodiments. This description therefore is intended to be regarded as illustrative instead of restrictive on embodiments of the present invention.

What is claimed is:

1. An apparatus comprising:
   a first and a second collection of capacitors and inductors, the second collection serially coupled to the first collection to cooperate with the first collection to filter a signal, the first and second collections jointly providing a bandpass filter having a transmission coefficient—frequency spectrum characteristic curve with two notches, one notch at each side of a passband, the first collection comprises a first capacitor and a first inductor combining to provide a first resonator, a second capacitor and a second inductor combining to provide a second resonator, and a third capacitor, the first and the second resonator being coupled to each other, at least in part, via the third capacitor; and
   the second collection comprises a fourth capacitor and a third inductor that are coupled in parallel to each other and serially coupled to the third capacitor.

2. The apparatus of claim 1, wherein the bandpass filter is configured to reduce strength of a signal having a frequency outside the two notches relative to the passband.

3. The apparatus of claim 2, wherein the bandpass filter is configured to reduce strength of a signal having a frequency outside the two notches relative to the passband, to at least 20 dB less than another signal having a frequency within the passband.

4. The apparatus of claim 3, wherein the bandpass filter is configured to reduce strength of a signal having a frequency outside the two notches relative to the passband to at least 30 dB less than another signal having a frequency within the passband.

5. The apparatus of claim 1, wherein the first and second inductors are adapted to jointly provide a transformer.

6. The apparatus of claim 1, wherein the first and second resonators are adapted to operate at a center frequency of the passband.

7. The apparatus of claim 1, wherein the first inductor and the first capacitor are coupled in parallel to a first conductive line and circuit reference respectively, and the first conductive line is coupled to a first side of the third capacitor.

8. The apparatus of claim 7, the second inductor and the second capacitor are coupled in parallel to a second conductive line and circuit reference respectively, and the second conductive line is coupled to a second side of the third capacitor, the second side of the third capacitor being on an opposite side from the first side of the first capacitor and being coupled to the capacitor and third inductor by the second conductive line.

9. The apparatus of claim 8, wherein a first end of the first conductive line is coupled to a fifth capacitor, the first end of the first conductive line being at the opposite end of a second end of the first conductive line that is coupled to the third capacitor.

10. The apparatus of claim 1, wherein the third inductor and the fourth capacitor are disposed in parallel and have at least one common node, the at least one common node being serially coupled to the third capacitor.

11. An apparatus comprising:
   a substrate;
   a first and a second collection of capacitors and inductors integrated in the substrate, the second collection serially coupled to the first collection to cooperate with the first collection to filter a signal, the first and second collections jointly providing a bandpass filter having a transmission coeficient—frequency spectrum characteristic curve with two notches, one notch at each side of a passband, the first collection comprises a first capacitor and a first inductor combining to provided a first resonator, a second capacitor and a second inductor combining to provide a second resonator, and a third capacitor, the first and the second resonator being coupled to each other, at least in part, via the third capacitor; and
   the second collection comprises a fourth capacitor and a third inductor couple in parallel to each other and serially coupled to the third capacitor.

12. The apparatus of claim 11, wherein the substrate is a package substrate.

13. The apparatus of claim 12, wherein the package substrate comprises a material selected from the group consisting of silicon, gallium arsenide, and low-temperature co-fired ceramic.

14. The apparatus of claim 11, wherein the substrate is adapted to process signals operating in one selected from the group consisting of wireless fidelity (WiFi), WiMax, ultra wide band (UWB) and cellular bands.

15. In an electronic device, a method of operation, comprising:
   receiving a signal; and
   processing the signal through a first and a second collection of capacitors and inductors, the second collection being serially coupled to the first collection, and cooperate with the first collection to jointly provide a bandpass filter having a transmission coefficient—frequency spectrum characteristic curve with two notches, one notch at each side of a passband, the first collection comprised of a first capacitor and a first inductor combining to provide a first resonator, a second capacitor and a second inductor combining to provide a first resonator, and a third capacitor, the first and the second resonator being coupled to each other, at least in part, via the third capacitor, and the second collection comprised of a fourth capacitor and a third inductor coupled in parallel to each other and serially coupled to the third capacitor.

16. The method of claim 15, wherein said processing comprises reducing strength of the signal, if the signal has a frequency outside the two notches relative to the passband.

17. The method of claim 16, wherein said reducing the strength of the signal comprises reducing the transmission coefficient to at least 20 dB less than another signal having a frequency within the passband.

18. The method of claim 17, wherein said reducing the strength of the signal comprises reducing the transmission coefficient to at least 30 dB less than another signal having a frequency within the passband.

19. The method of claim 15, wherein said processing of the signal through the first and the second collection comprises filtering the signal relative to the passband.

20. The method of claim 15, wherein said method further comprises processing the signal through a capacitor prior to or subsequent to processing the signal through the first or the second collections.

* * * * *

UNITED STATES PATENT AND TRADEMARK OFFICE
CERTIFICATE OF CORRECTION

PATENT NO. : 7,262,674 B2
APPLICATION NO. : 11/154078
DATED : August 28, 2007
INVENTOR(S) : Telesphor Kamgaing It is certified that error appears in the above-identified patent and that said Letters Patent is hereby corrected as shown below:

Column 6
Line 10, "...coupled to the capacitor..." should read --...coupled to the fourth capacitor...--.

Column 6
Lines 34 and 41, "An apparatus comprising:

a substrate;

a first...to provided a...; and the second...couple in parallel..."

should read

--...a first...to provide a...; and the second...coupled in parallel...--.

Column 7
Line 1, "In an electronic...comprising:

receiving a signal; and processing...a first resonator,..."

should read

--...processing...a second resonator,...--.

Signed and Sealed this

Seventeenth Day of March, 2009

JOHN DOLL
*Acting Director of the United States Patent and Trademark Office*